United States Patent
Nagata

(10) Patent No.: US 6,659,335 B2
(45) Date of Patent: Dec. 9, 2003

(54) SOLDERING METHOD AND SOLDERING APPARATUS

(76) Inventor: Eishu Nagata, 453-23, Wakabadai, Nagareyama-shi, Chiba 270-0123 (JP)

(*) Notice: Subject to any disclaimer, the term of this patent is extended or adjusted under 35 U.S.C. 154(b) by 0 days.

(21) Appl. No.: 10/198,955

(22) Filed: Jul. 22, 2002

(65) Prior Publication Data

US 2002/0170946 A1 Nov. 21, 2002

Related U.S. Application Data

(62) Division of application No. 09/761,655, filed on Jan. 18, 2001, now Pat. No. 6,457,634.

(30) Foreign Application Priority Data

Jan. 18, 2000 (JP) .......................................... 2000-9028

(51) Int. Cl.[7] ................................................ B23K 3/06
(52) U.S. Cl. ...................................................... 228/256
(58) Field of Search ................................ 228/256, 257, 228/33, 180.1, 102; 222/591, 593, 8

(56) References Cited

U.S. PATENT DOCUMENTS

| 4,934,309 A | 6/1990 | Ledermann et al. |
| 5,038,995 A | 8/1991 | Nagata |
| 5,042,708 A | * 8/1991 | Ledermann et al. .......... 228/55 |
| 5,297,718 A | 3/1994 | Nagata |
| 5,316,700 A | * 5/1994 | Soye et al. ................... 264/1.1 |
| 5,358,169 A | 10/1994 | Caddock et al. |
| 5,605,276 A | 2/1997 | Nagata |
| 5,878,939 A | 3/1999 | Luchinger et al. |

FOREIGN PATENT DOCUMENTS

| EP | 0 574 218 A | 12/1993 |
| JP | 46-34209 | 10/1971 |
| JP | 50-77427 | 7/1975 |
| JP | 62-270272 | 11/1987 |

* cited by examiner

*Primary Examiner*—Tom Dunn
*Assistant Examiner*—Jonathan Johnson
(74) *Attorney, Agent, or Firm*—Sughrue Mion, PLLC

(57) ABSTRACT

A soldering device and method includes the steps of forming a solder melting pot by assembling plural trowel members, supplying a solder tip to the solder melting pot, and sequentially repeating the operation for supplying the molten solder to the respective soldering point. In the improvement, an additional heating portion which comes close to the solder melting pot is formed near or with the trowel members, and the soldering point to which molten solder has already been supplied by the prior molten solder supplying operation is additionally heated during the supplying operation of the next soldering point. The trowel members are used to simultaneously perform the operation for supplying the molten solder and another operation for additionally heating the soldering point to which the molten solder has been supplied. A plurality of points to be soldered aligned at predetermined intervals are efficiently soldered.

8 Claims, 17 Drawing Sheets

FIG. 10A
FIG. 10B
FIG. 10C
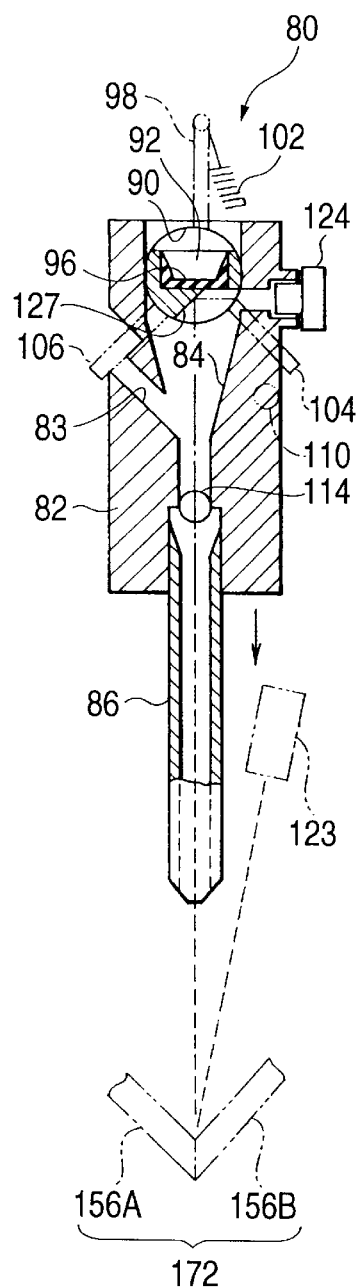
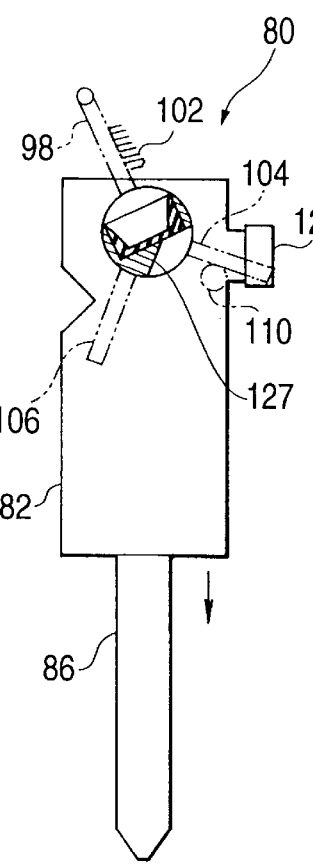
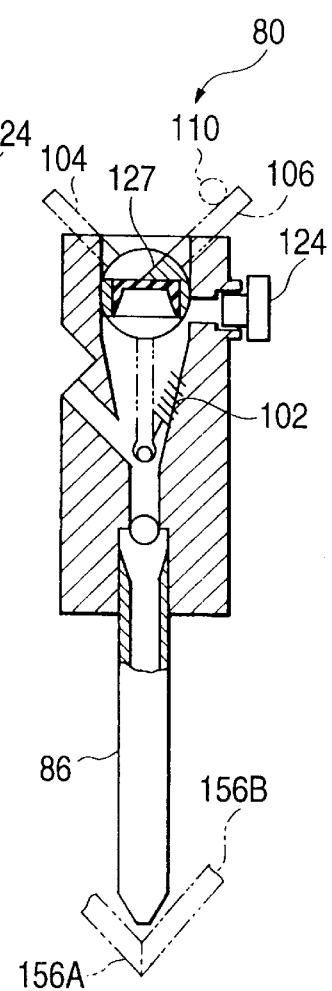

SOLDERING METHOD AND SOLDERING APPARATUS

This is a divisional of application Ser. No. 09/761,655 filed Jan. 18, 2001 now U.S. Pat. No. 6,457,634, the disclosure of which is incorporated herein by reference.

FIELD OF THE INVENTION

The present invention relates to a soldering method and soldering apparatus for dropping molten or semi-molten solder (hereinafter referred to simply as molten solder) on a workpiece to effect soldering.

BACKGROUND OF THE INVENTION

There is proposed a soldering apparatus for automatically applying molten solder onto a desired point or area of a workpiece, such as a printed circuit board, wherein a conical pot is used for melting a solid solder (Japanese Patent Publication (KOKOKU) No. 46-34209 (1971)). A rod-shaped solder is cut and fed to the conical pot to be melted therein and the molten solder is allowed to drop onto a workpiece through a hole provided at the bottom of the pot. However, this type soldering apparatus has a problem that some portion of the solid solder drops through the hole in the unmelted state while the other portion of the solder is dropped in the overheated condition, since it is impossible to retain the whole solid solder for a constant time, resulting in uneven and unreliable soldering.

There is also proposed a soldering apparatus having a conical melting pot provided with a needle valve at the bottom of the pot (Unexamined Japanese Utility Model Publication (KOKAI) No. 50-77427 (1975)). In this known apparatus, a molten mass of solder is contained in the conical melting pot, and a constant volume of the molten solder is allowed to drop through the needle valve. However, due to surface tension of the molten solder, it becomes impossible to control the volume of dropping molten solder precisely particularly when the volume of molten solder to be applied onto the workpiece is relatively small, as is the case where the workpiece is a printed circuit board.

In order to solve the aforementioned problems of the known apparatuses, the present inventor has previously proposed an improvement in soldering in my earlier Japanese Patent Application No. 61-110505 (1986) which is published as JP-A-62-270272. According to my previous proposal, a solder melting pot is formed by plural trowel members which engage with each other to hold a solid solder tip or piece for a pre-set time to melt the same and then they are separated to allow the molten solder to drop onto a desired point or area of a workpiece.

These conventional methods must prevent so-called "knotty or tubercled soldering" by allowing additional heating the soldering point to enable excellent flow of molten solder to the soldering point after supplying molten solder to the soldering point. In this case, the trowel members are separated and raised to allow the molten solder to drop onto the soldering point, and the trowel members are again lowered to come close to the same desired point right after dropping.

However, such a process leads to the deteriorated process efficiency when a plurality of desired points are to be soldered. That is, the time duration for supplying the molten solder and the time duration for additional heating are required with respect to one point to be soldered.

Further, it is desirable to preheat a point to be soldered before supplying the molten solder. It can be considered to provide a preheat time during which the tip-ends (lower ends) of the trowel members are moved close to the soldering point before the trowel members are opened to drop the molten solder. However, by doing so, a time required for supplying the molten solder, an additional heating time and a preheat time therefor are required with respect to one point to be soldered. Thus, the process efficiency is further deteriorated.

SUMMARY OF THE INVENTION

In view of the above described problems, it is a first object of the present invention to provide a soldering method by which a plurality of soldering points aligned at predetermined intervals can be efficiently soldered.

It is a second object of the present invention to provide a soldering apparatus directly used for realization of such a soldering method.

According to the present invention, the first object is attained by a soldering method for soldering plural soldering points aligned at a predetermined interval; comprising the steps of forming a solder melting pot by assembling plural trowel members, each of the trowel members having a surface made of a solder repellent material at least the portion contacting with the solder; supplying a solder tip having a constant volume to said solder melting pot; and sequentially supplying the molten solder to the respective soldering points from the solder melting pot:

an improved method wherein an additional heating portion which comes close to said solder melting pot is formed to said trowel members, and wherein the soldering point to which molten solder has been supplied by prior molten solder supply operation is additionally heated during the supply operation of the molten solder to the next soldering point.

In the present invention, the trowel members are used to simultaneously perform the molten solder supply operation and the additional heating operation for the soldering point to which the molten solder was supplied by the preceeding molten solder supply operation.

In the present specification, the term "soldering point" means a point or portion to be soldered of a workpiece, and includes a point or portion which will be soldered or has been soldered.

The solder melting pot may be formed by grooves formed on the opposing surfaces of the trowel members so that a cavity defining the solder melting pot is formed by these grooves when the trowel members engages with each other. Such a solder melting pot may have an opening or hole at the bottom of the pot. In this case, the opening may be closed or plugged by the upper surface or portion of the soldering point when the trowel members are lowered to come close to the soldering point. That is, the solder melting pot is formed by engaging the trowel members and the bottom opening of the pot is closed with the soldering point by lowering the trowel members assembly to come close to the soldering point. The solid solder tip is dropped to the formed and closed solder melting pot to be-molten. The molten solder can be supplied to the soldering point by moving up the trowel members. Otherwise, the trowel members may be opened or separated to supply the molten solder to the soldering point.

A plurality of solder melting pots may be formed by one set of the trowel members so that each solder melting pot can simultaneously supply the molten solder to different points to be soldered by separating or raising the trowel members. For example, the solder melting pots may be provided at intervals equal to pitches of the soldering points. In this case, the additional heating portion is also formed between the solder melting pots. Alternatively, the solder melting pots may by provided at intervals as integral multiples of the same pitches. The additional heating portion is formed along the length of the multiple pitches so that it can move close to the plural soldering points ready to be soldered at the same time.

It is possible to effect the control so that a workpiece having plural soldering points can continuously move relative to the trowel member in an alignment direction of the soldering points at a fixed speed and the solder melting pot(s) can supply molten solder to predetermined points to be soldered. A workpiece may move intermittently or move while changing the speed. For example, when a plurality of solder melting pots are formed by a plurality of sets of trowel members provided along the alignment direction of the soldering points, it is preferable to periodically change the workpiece transfer speed for each of a predetermined number of soldering processes based on the number of the solder melting pots or intervals.

By providing to the trowel members a preheating portion which is placed to the opposed side of the additional heating portion with the solder melting pot therebetween, this preheating portion can be used to preheat a next soldering point to which molten solder is to be supplied. That is, the molten solder supplying operation, the additional heating operation for the soldering point to which the molten solder has been supplied by the preceeding supplying operation, and the preheating operation for a next soldering point can be simultaneously carried out.

The second object of the present invention can be attained by the provision of a soldering apparatus for soldering plural soldering points of a workpiece, the plural soldering point being aligned at a predetermined interval, comprising:

- plural trowel members each having a surface made of a solder repellent material at least the portion contacting with a solder, said plural trowel members being engaged together to form a solder melting pot and separated from each other to supply the molten solder to the soldering point, a solder tip having a constant volume being supplied to said solder melting pot to be molten and then allowed to drop when said plural trowel members are separated from each other;
- an additional heating portion which is formed to said trowel members in close vicinity to said solder melting pot and additionally heats an adjacent soldering point to which the molten solder has been already supplied during an operation of said solder melting pot for supplying the molten solder to the next soldering point;
- a workpiece holder for relatively moving the workpiece with respect to said trowel members along an alignment direction of the plural soldering points; and
- a controller for moving said workpiece holder and controlling said trowel members in synchronism with the relative movement of the workpiece, so that said trowel members are moved up and down and/or opened and closed to supply the molten solder from said solder melting pot to each of the soldering points of the workpiece.

The solder melting pot may be formed by grooves formed on the opposing surface of the trowel members. A cavity defining the solder melting pot is formed by engaging the opposing trowel members. The molten solder can be supplied to the soldering point by separating the trowel members. The solder melting pot formed by the grooves of the trowel members may have a bottom opening which can be closed or plugged with the upper portion of the soldering point when the trowel members are lowered to come close the soldering point. In this case, the molten solder can be supplied to the soldering point when the bottom of the solder melting pot is opened by moving up or opening the trowel members.

When a plurality of solder melting pots are provided to the assembly of the trowel members at the same pitches as those of the soldering points or pitches of integral multiples, plural points can be soldered all at once, thereby improving the efficiency.

When the preheating portion is provided to the trowel members so that the preheating portion is arranged on the opposed side of the additional heating portion with the solder melting pot therebetween, the molten solder supplying operation, the additional heating operation and the preheating operation can be performed all at once.

BRIEF DESCRIPTION OF THE DRAWINGS

FIGS. 10A to 10C are views for illustrating the operation of a cradle;

DETAILED DESCRIPTION OF THE PREFERRED EMBODIMENTS

Presently preferred embodiments of the present invention will now be described in detail with reference of the appended drawings. The main body A for use in an embodiment will first be described with reference to FIGS. 1 to 10.

Main Body

Figure 1:
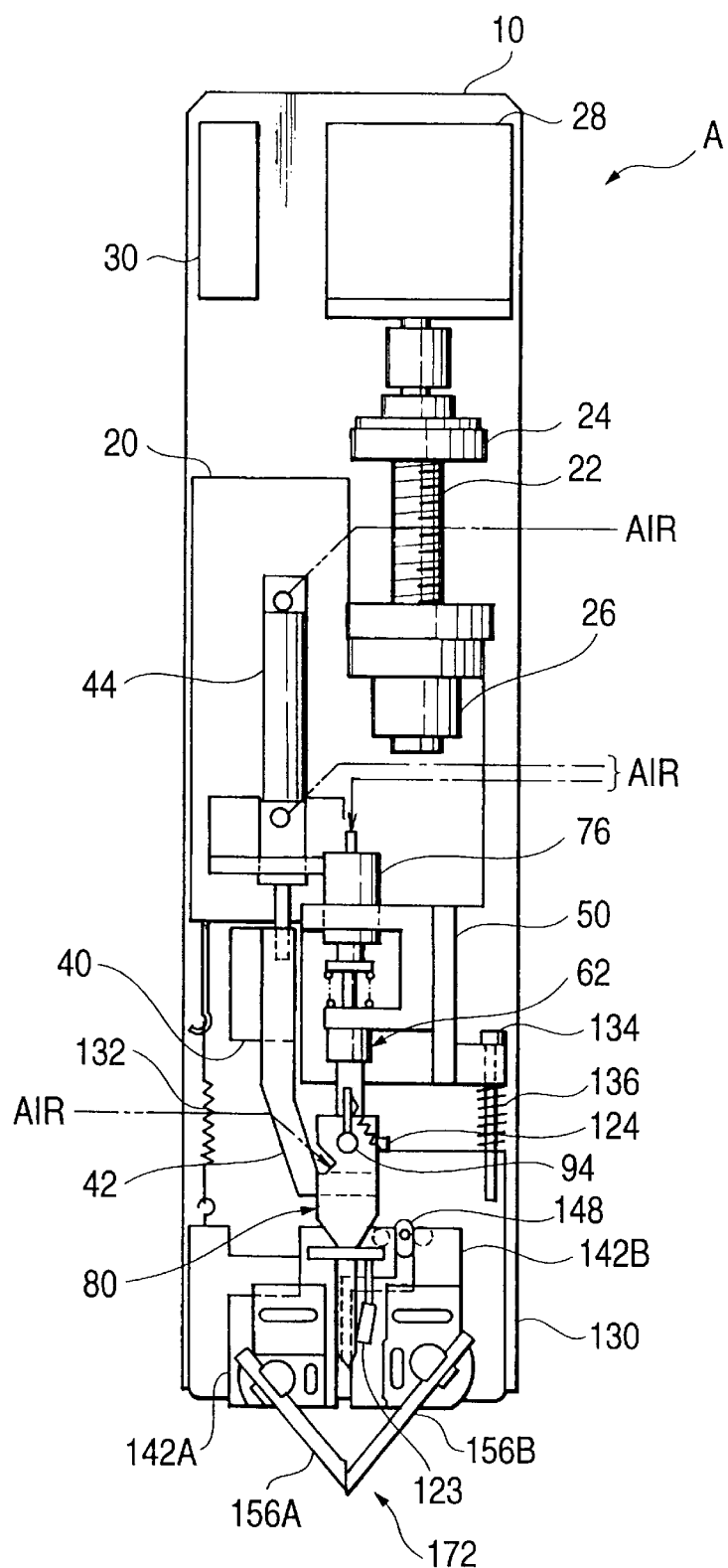
FIG. 1 is a front end view of a main body A for use in a soldering apparatus according to an embodiment of the present invention.
Figure 2:
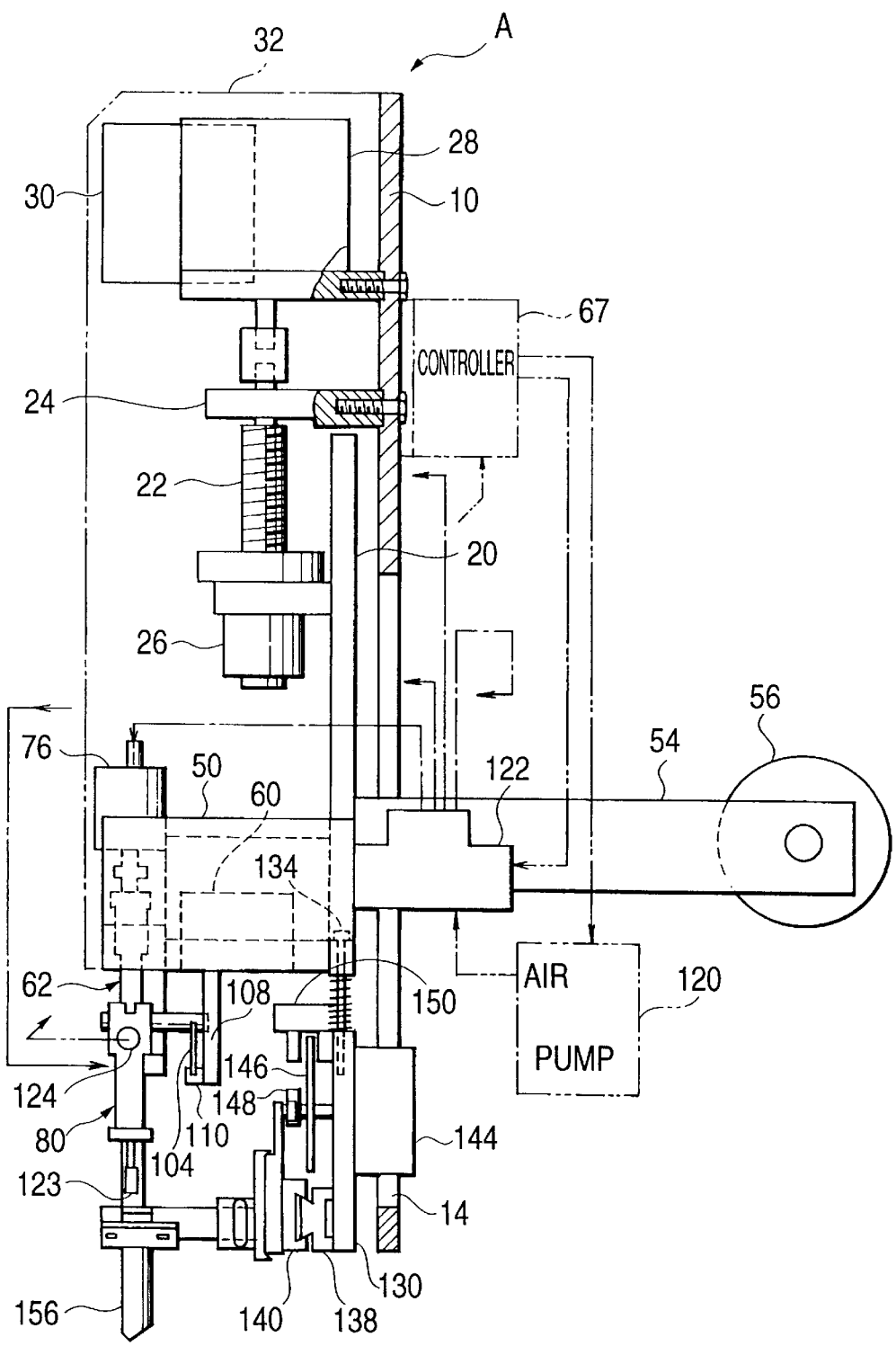
FIG. 2 is a side view of the main body A depicted in FIG. 1.
Figure 3:
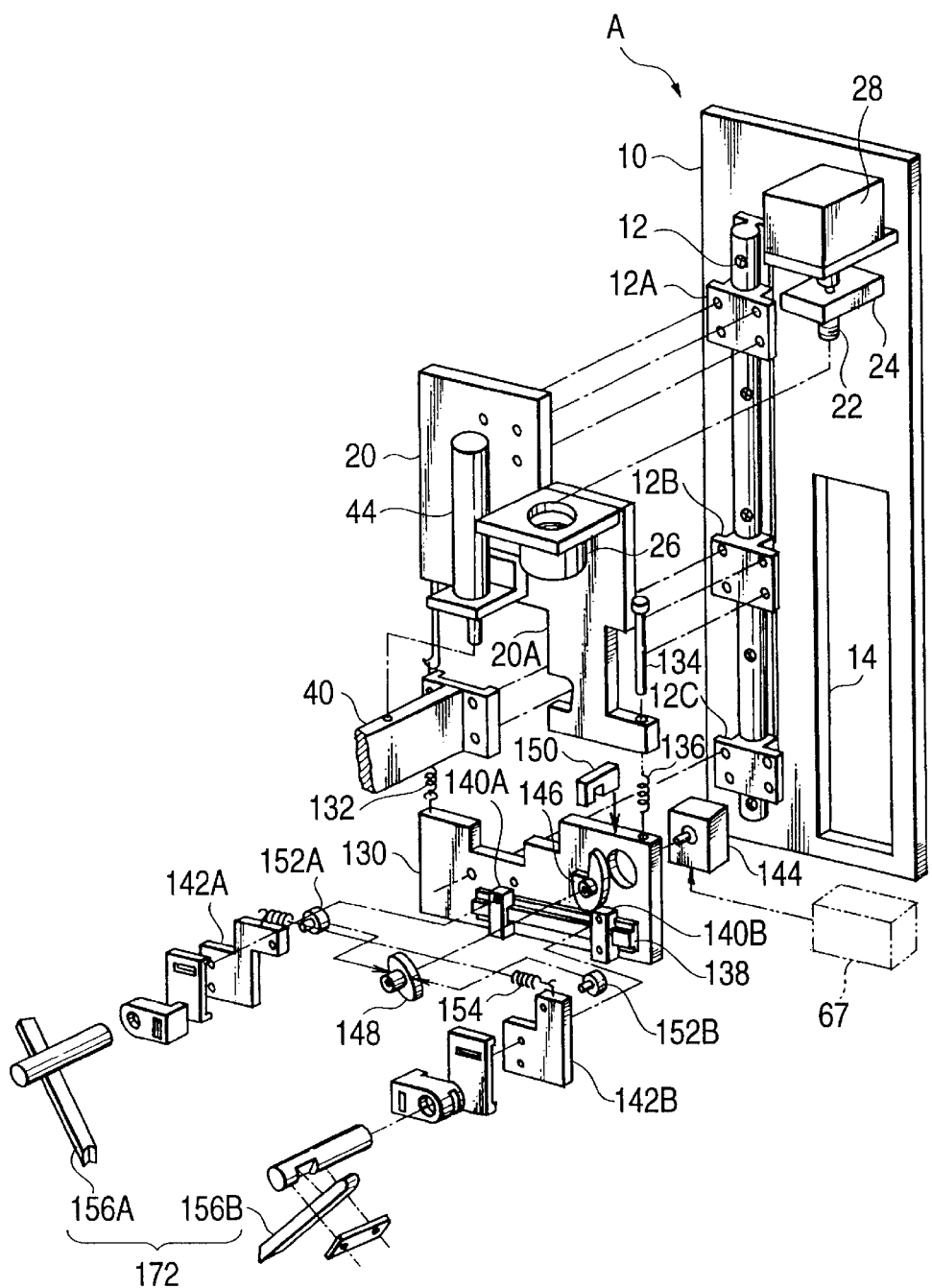
FIG. 3 is an exploded perspective view showing parts of the main body A depicted in FIG. 1.
Figure 4:
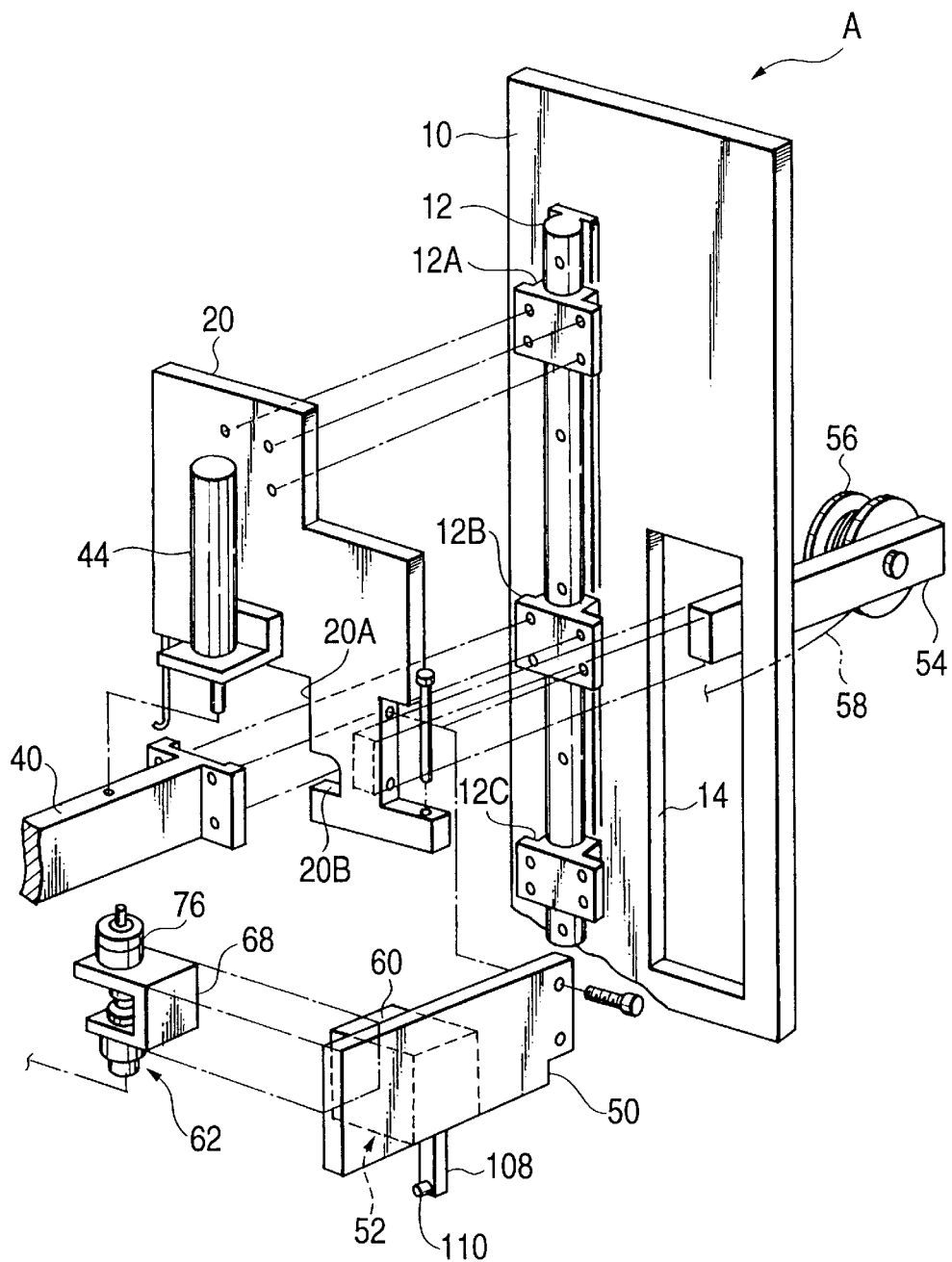
FIG. 4 is a partially exploded perspective view showing parts of the main body A depicted in FIG. 1.
Figure 5:
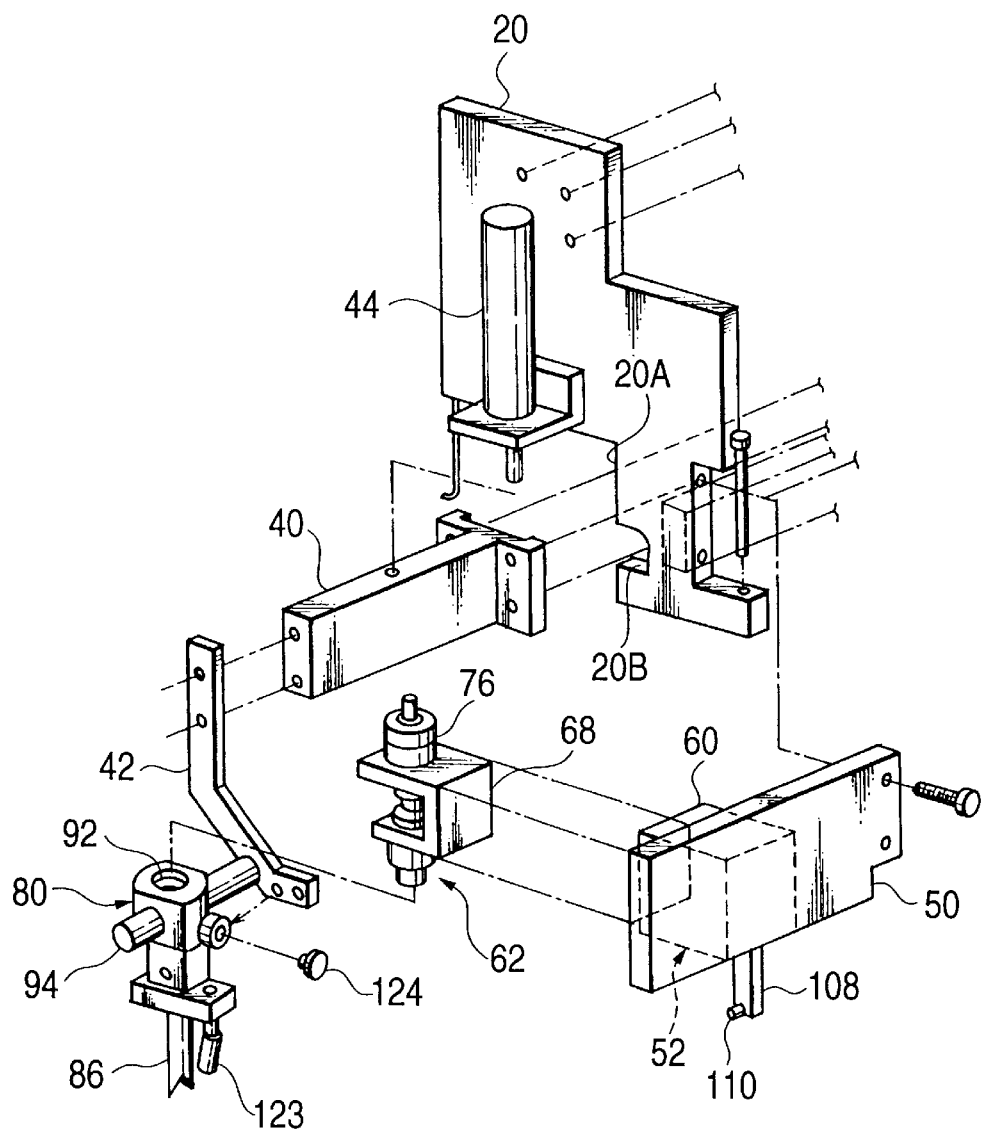
FIG. 5 is a further exploded perspective view showing parts of the main body A of FIG. 1.

The main body A is assembled to a carrier plate denoted by reference numeral 10 in FIGS. 1 to 4. The carrier plate 10 is attached to a moving device B shown in FIG. 11 so as to be capable of vertically and horizontally moving. This carrier plate is elongated, and a linear bearing track 12 (FIGS. 3 and 4) is fixed on one side of the carrier plate 10 to extend vertically, and three movable blocks 12A, 12B and 12C are movably mounted on the track 12. Each of the movable blocks 12A to 12C contains a bearing and is moved smoothly along the track 12 in the vertical direction without rotating around the track 12. An elongated window or opening 14 is formed through the carrier plate 10 at the right side as seen in FIGS. 3 and 4.

A movable plate 20 is fixed to the uppermost movable block 12A to be moved in the vertical direction. A feed screw 22 extends in the vertical direction and has an upper end fixedly held by a bearing holder 24 which is fixed at an upper right portion of the carrier plate 10, the feed screw being thrusted into a nut holder 26 fixed to the movable plate 20. The feed screw 22 is rotated by a stepping motor 28 secured to an upper portion of the carrier plate 10. As the feed screw 22 rotates, the movable plate 20 which is integrally fixed to the nut holder 26 is moved in the vertical direction.

A fan motor 30 is provided at the left side (as viewed in FIGS. 1 and 2) of the motor 28. The top, front, left and right sides of the main body A of the soldering apparatus are covered by a cover plate 32 (see FIGS. 2 and 11), and the carrier plate 10 serves as a backing plate. Fresh air is introduced by the fan motor 30 into the space covered by the cover plate 32, and the thus introduced air is flown downwards inside the cover plate 32 to remove smokes generating from the solder as it is melted.

In FIGS. 1, 3, 4 and 5, a solder guide bracket is denoted by reference numeral 40. The bracket 40 is fixed to the intermediate movable block 12B mounted on the linear bearing track 12 and extends forwardly through a cut-out 20A formed through the upper movable plate 20. An arm 42 is fixed to the fore end of the bracket 40 and has a lower end extending to a vicinity of the front center portion of the soldering apparatus. A solder guide assembly 80 serving as a solder tip guide means, which will be described in detail hereinafter, is fixed to the lower end of the arm 42.

The bracket 40 is moved in the vertical direction by means of an air cylinder 44 which is fixed to the upper movable plate 20. In detail, the cylinder of the air cylinder 44 is fixed to the upper movable plate 20, and a piston rod operatively associated with the air cylinder 44 has an lower end secured to the top face of the bracket 40.

In FIGS. 1, 2, 4, 5 and 6, reference numeral 50 designates a solder feeder plate fixed on the upper movable plate 20. As shown in FIG. 4, the plate 50 is fixedly secured on the right end face of the upper movable plate 20 to extend forwardly. A solder tip supply assembly 52 is mounted on the plate 50, and the solder tip supply assembly 52 supplies a solder tip 58A cut to have a constant length to the solder guide assembly 80 which will be described in detail hereinafter.

Referring to FIGS. 2 and 4, a reel holding arm is denoted by 54 and has one end fixed to the back side of the upper movable plate 20 and the other end extending rearwards through the window 14 of the carrier plate 10. A solder reel 56 is held by the reel holding arm 54, and a continuous rod-shaped or wire solder 58 is fed from the reel 56 to pass through a window 20B (see FIG. 4) formed aside the cut-out 20A of the upper movable plate 20 into the solder tip supply assembly 52.

Figure 6:
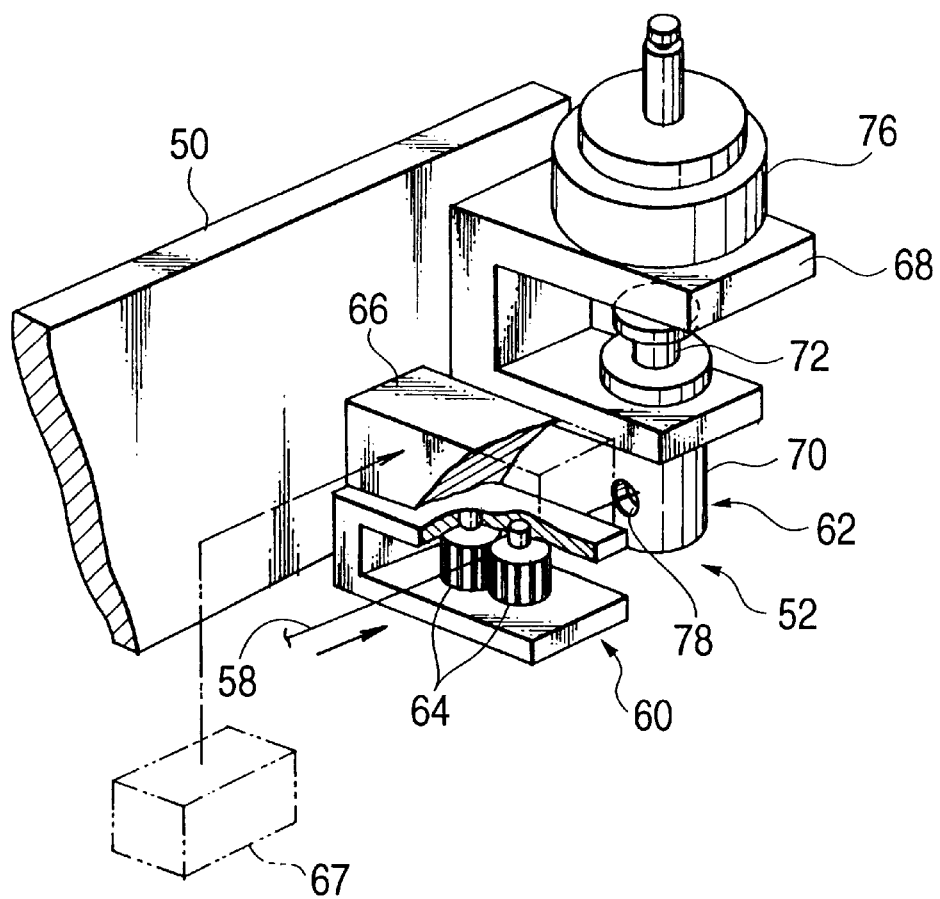
FIG. 6 is a perspective view of a solder tip supply assembly.
Figure 7:
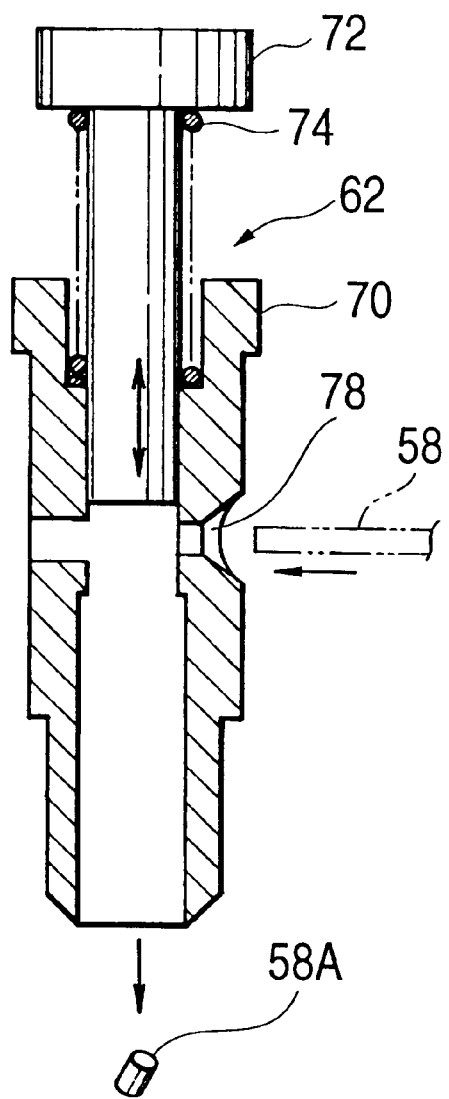
FIG. 7 is a cross-sectional view of a solder cutter for cutting a solder tip from a wire or rod of a solder.

The solder tip supply assembly 52 comprises a feed section 60 and a cutter section 62, as shown in FIG. 6. The feed section 60 includes paired roller 64, 64 for grasping the solder 58, and a stepping motor 66 which drives one of the rollers 64. The motor 66 is controlled by a controller 67 shown in FIG. 2 to rotate the roller 64 at a pre-set timing to feed a predetermined length of the solder 58 to the cutter section 62.

The cutter section 62 includes a holder 68 secured to the feeder plate 50 and having a shape of lying squalish letter U, a cylindrical body 70 secured to the bottom face of the lower leg of the holder 68, a cutter pin 72 movably inserted into the body 70, a restoration spring 74 (see FIG. 7) for restoring the cutter pin 72 to the upper position, and an air cylinder 76 mounted on the upper leg of the holder 68 to press the cutter pin 72 downwardly. A solder inlet port 78 is provided through the side wall of the body 70 and faces to the paired rollers 64, 64.

As a pre-set length of the rod-shaped solder 58 is fed by the feed section 60, the fore end of the solder 58 is moved through the solder inlet port 78 into the bore of the body 70, and then air is fed into the air cylinder 76 by changing over a change-over valve 122 in response to the instruction from the controller 67 so that the cutter pin 72 is pressed downwards. Whereupon, the fore end of the solder 58 is cut, and the cut solder tip 58A falls downwards through the bore of the body 70.

Figure 8:
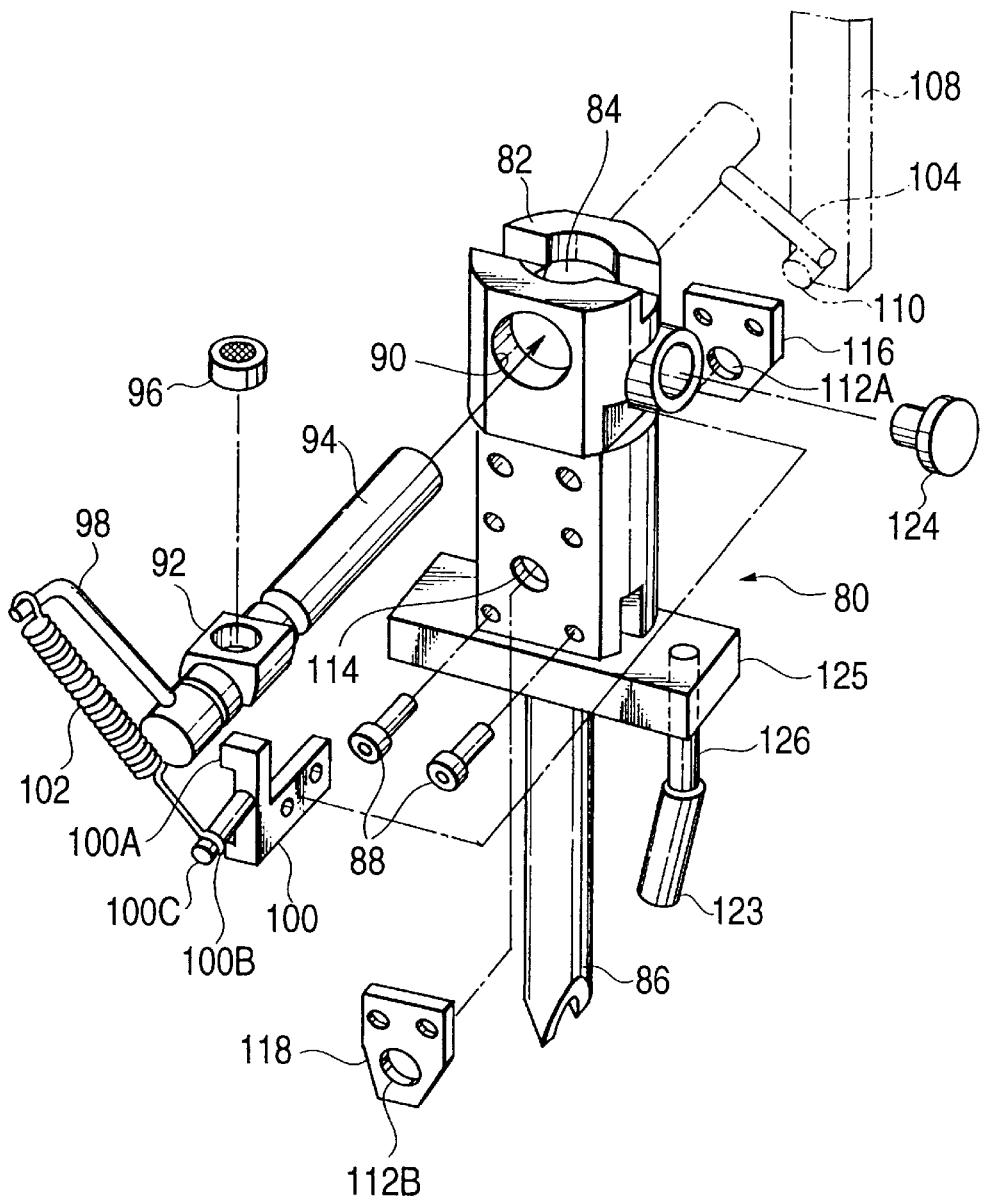
FIG. 8 is an exploded perspective view showing the details of the solder tip guide assembly.
Figure 9:
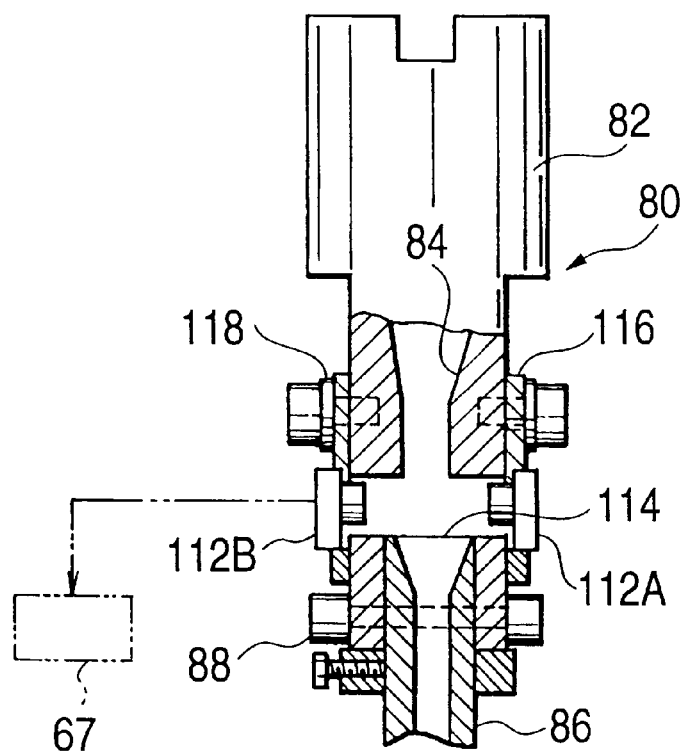
FIG. 9 is a sectional side elevation taken along the center line of the solder tip guide assembly.

As shown in FIGS. 8 to 10, the solder guide assembly 80 has a body 82 through which a guide bore 84 is formed. The guide bore 84 extends in the vertical direction and has a funnel-shaped upper portion and a lower portion connected to a sleeve 86. In detail, a slot is formed transversely through the lower portion of the body 82, and the sleeve 86 inserted in the lower portion of the body 82 is fixed by fastening screws 88 (see FIGS. 8 and 9).

A transverse through-hole 90 extends through the wall of the body 82 at the position where the upper enlarged portion (i.e. the funnel-shaped upper portion) of the guide bore 84 is formed. A cradle 92 is contained in the enlarged portion of the guide bore 84, and a shaft 94 integrally fixed to the cradle 92 extends through the transverse through-hole 90. The cradle 92 serves as a receiver for receiving the solder tip 58A falling from the cutter section 62 and has the inner surface fitted with a cup 96 made of a fluorocarbon resin, such as Teflon (Trade Name) for preventing the solder tip 58 to stick onto the inner surface of the cradle 92. The inner surface of the cup 96 may be embossed with fine embosses or fine indents to facilitate smoother delivery of the solder tip 58A. Otherwise, the inner surface of the cradle 92 may be lined with a fluorocarbon resin.

The shaft 94 has a fore end to which an arm 98 is connected. A stopper 100 is connected to the body 82 so that the arm 98 swings as the shaft 94 is rotated by about 180 degrees between upper and lower opposing walls 100A and 100B of the stopper 100. When the arm 98 engages with the upper wall 100A of the stopper 100, the cradle 92 is held at the upside position where the opening of the cradle 92 faces upwards as shown in FIG. 10A. When the arm 98 engages with the lower wall 100B of the stopper 100, the cradle 92 is inverted to be held at the upside-down position where the opening of the cradle 92 faces downwards as shown in FIG. 10C. A coil spring 102 extends between the bent end of the arm 98 and a pin 100C fixed to the stopper 100 to retain the cradle 92 stably at the upside position shown in FIG. 10A and also at the upside-down position shown in FIG. 10C.

Two pins 104 and 106 are mounted to the rear end of the shaft 94 and extend radially from the shaft 94, the angle between the pin 104 and the pin 106 being about 90 degrees. These pins 104 and 106 extend obliquely as shown in FIG. 10A when the cradle 92 is retained in the upside position. On the other hand, an arm 108 (see FIGS. 2, 4, 5 and 8) is connected to the feeder plate 50 which is integrally mounted to the upper movable plate 20, the arm 108 extending downwardly and having the lower end from which a cam follower 110 protrudes to be engaged with the pins 104 and 106. With such a construction, as the solder guide assembly 80 is moved in the vertical direction by means of the air cylinder 44, these pins 104 and 106 engage with the cam follower 110 so that the cradle 92 is inverted between the upside position shown in FIG. 10A and the upside-down position shown in FIG. 10C. Namely, when the coil spring 102 goes beyond the unstable point of the arm 98 as the solder guide assembly 80 is lowered, the cradle 92 is swiveled to be retained in the upside-down position.

A sensor 112 for sensing the falling solder tip 58A is disposed in the body 82 of the solder guide assembly 80 (see FIGS. 8 and 9). In detail, a transverse hole 114 is formed through the body 82 and crosses the solder guide bore 84 at right angle, and a light emitting element 112A is disposed at one end of the hole 114 and fixedly retained by a sensor carrying plate 116 while a light receiving element 112B is disposed at the other end of the hole 114 and fixedly retained by another sensor carrying plate 118. As the light receiving element 112B senses passage of the solder tip 58A, the controller 67 actuates clock means contained therein which counts the time from the timing at which the solder tip 58A is sensed. The time period for retaining and melting the solder tip 58A within the solder melting pot 157 formed by the trowel members 156, the details of which will be described hereinafter, is controlled by the controller 67 with reference to the lapse of time counted by the clock means.

The body 82 of the solder guide assembly 80 is also provided with an air inlet port 83 (see FIG. 10A) through which air is blown into the guide bore 84. The air blown through the inlet port 83 prevents the smoke generated from the molten solder in the trowel members 156 from sticking to the inner surface of the guide bore 84 to ensure smooth fall-down of the solder tip 58A.

Air fed to the body 82 and the air cylinders 44 and 76 is supplied from an external air pump 120, as shown in FIG. 2, and intermittently supplied by means of a change-over valve 122.

The solder guide assembly 80 is provided with a light emitting element 123 and a light receiving element 124 (FIGS. 2, 5, 8 and 10A). In detail, a horizontal plate 125 is fixed to the body 82, and a rod 126 extends downwardly from the plate 125 and has a lower end to which the light emitting element 123 is secured (FIG. 8). The light emitting element 123 may be LED, semiconductor laser or another type light emitting element and emits a light beam toward a portion of the molten solder contained in the melting pot 172 formed by two opposing trowels 156 (156A, 156B), as viewed in FIG. 10A.

The light receiving element 124 may be, for example, a photo transistor and is secured on the side wall of the body 82. On the other hand, a reflector mirror 127 (FIG. 10) is formed on the bottom of the cradle 92. As shown in FIG. 10A, the mirror 127 has a reflecting surface which extends at an angle of 45 degrees relative to the horizontal plane when the cradle 92 is in the upside condition. As the solder is melted in the solder melting pot 157 formed by the trowel members 156, the light beam from the light emitting element 123 is reflected by the surface of the molten solder mass and a portion of the reflected light beam passes through a sleeve 86 and the guide bore 84. The mirror 127 reflects the light beam passing through the sleeve 86 and the guide bore 84 to the light receiving element 124.

Driving Mechanism of Trowel Members

The details of the heatable trowel members 156A, 156B which come together to form the solder melting pot 172 will now be described. In FIG. 3, reference numeral 130 designates a lower movable plate. The lower movable plate 130 is secured to the movable block 12C (FIGS. 3 and 4) to be moved in the vertical direction. The left side of the lower or first movable plate 130 is suspended from the upper or second movable plate 20 through a coil spring 132, and the right side thereof is suspended from the upper movable plate 20 through a long bolt 134. As a result, the lower movable plate 130 is moved in the vertical direction together with the upper movable plate 20 (FIGS. 1, 2 and 3).

The bolt 134 is slidingly inserted through a bore formed in the upper movable plate 20 so that the lower movable plate 130 is moved upwards together with the trowel members 156 when the trowel members 156 impinge on the surface of the workpiece to prevent damage of the workpiece upon such impingement by the trowel members 156. A compression spring 136 is disposed around the bolt 134 to apply a proper compression force on the trowel members 156 when it is desired to press the trowel members 156 onto the surface of the workpiece.

A slide rail 138 is secured to the lower movable plate 130 and extends horizontally (FIGS. 2 and 3). Movable blocks 140A and 140B are slidingly mounted to the rail 138, and paired trowel member carrier plates 142 (142A, 142B) are fixed to the movable blocks 140A and 140B. A stepping motor 144 is mounted on the back side of the lower movable plate 130 and has a shaft extending forwards through the lower movable plate 130. An encoder cam 146 and a cam 148 are fixedly mounted on the fore end of the shaft of the motor 144.

The encoder cam 146 detects the rotation angle of the motor 144 by a photo-sensor 150. The cam 148 has a generally elliptical contour and symmetrically mounted on the shaft of the motor 144. Cam followers 152 (152A, 152B) mounted to the aforementioned trowel member carrier plates 142 rotatably engage with the cam 148 from the right and left sides. The trowel member carrier plates 142 are biased by a spring 154 to be applied with a force which acts to allow the carrier plates 142 to come close with each other (see FIG. 3).

In the illustrated embodiment, paired trowel members (or soldering iron members) 156 (156A, 156B) are secured to the trowel member carrier plates 142A, 142B, the angle and position of each trowel member 156 being adjustable. These trowel members 156 extend obliquely from the carrier plates 142A, 142B to have their lower ends separably engaged with each other just beneath the sleeve 86 connected to the aforementioned solder tip guide assembly 80. When these trowel members 156A, 156B come close with each other, they form the solder melting pot 157 having a V-shaped section when viewed from the front side. Each trowel member 156 contains a Nichrome wire heater and has a surface made of a material which repels molten solder, such as ceramics, fluorocarbon resin or stainless steel. A silicon nitride ceramic material is particularly preferred, since it is highly resistive to permeation of solder and to chemicals, such as hydrochloric acid, contained in the flux of the solder and also has improved durability.

Moving Device

Figure 11:
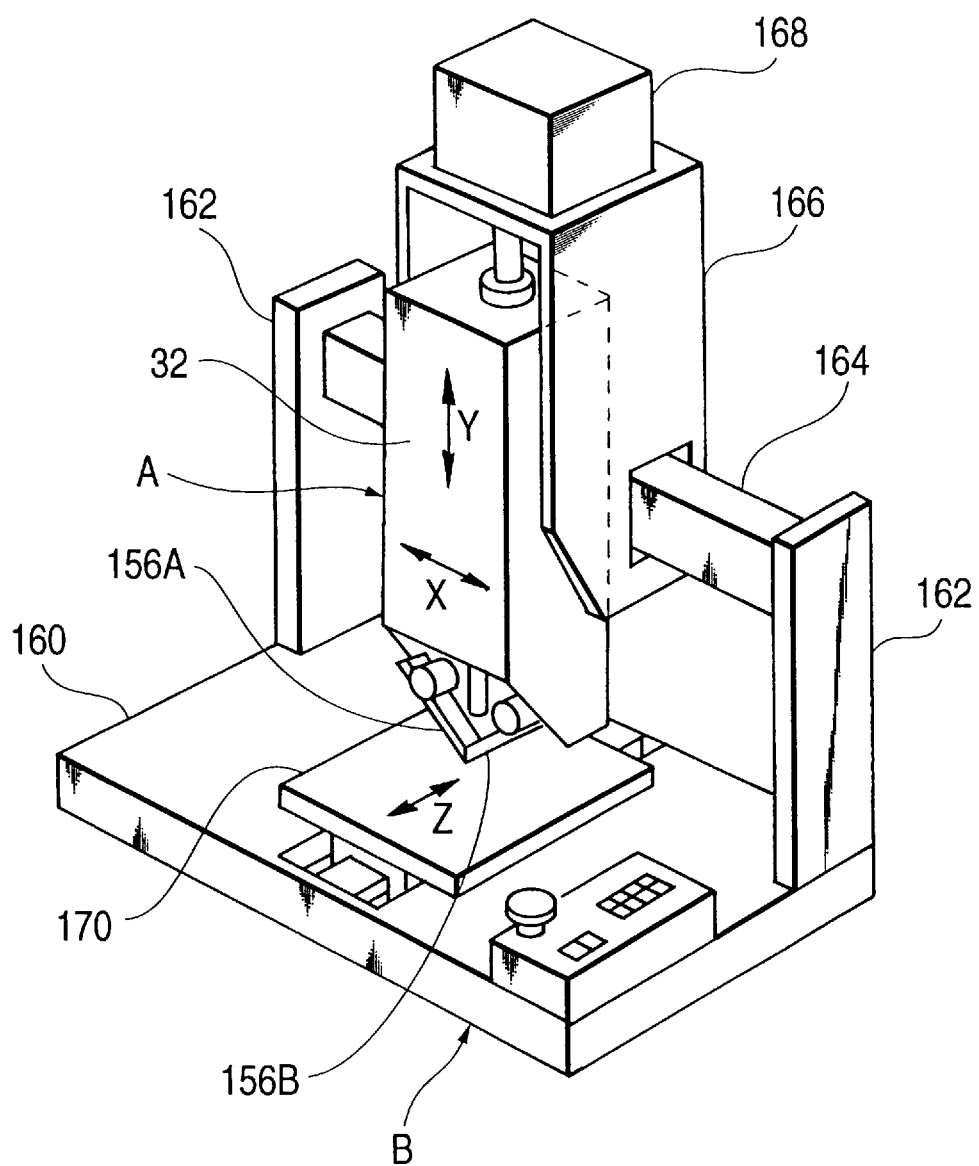
FIG. 11 is a view showing the state in which the main body A is combined with a moving device B.

The main body A is combined with the moving device B shown in FIG. 11 for use. The moving device B includes a base board 160, a pair of column supports 162 erected on the base board 160, and a horizontal rail 164 held by the column supports 162. A movable box 166 capable of moving in a horizontal direction (X direction) is held by the horizontal rail 164.

The main body A is held by this movable box 166 so as to be capable of vertically moving. The main body A vertically moves by a driving unit 168 provided on the upper part of the movable box 166 to perform positioning in a Y direction (vertical direction). The main body A is held by the movable box 166 so that the trowel members 156 move close to or away from each other along the direction parallel to the horizontal rail 164. In addition, a workpiece support or holder 170 capable of moving in the front-and-back direction (Z direction) is disposed on the upper part of the base board 160.

A print wiring board is mounted to the workpiece holder 170 and moves the movable box 166 and the workpiece support board 170 in directions orthogonal to each other (X and Z directions) so that the workpiece is positioned below the assembly of the trowel members 156. Soldering is effected by moving the main body A in the vertical direction (Y direction).

Shape of Trowel Members

Figure 12:
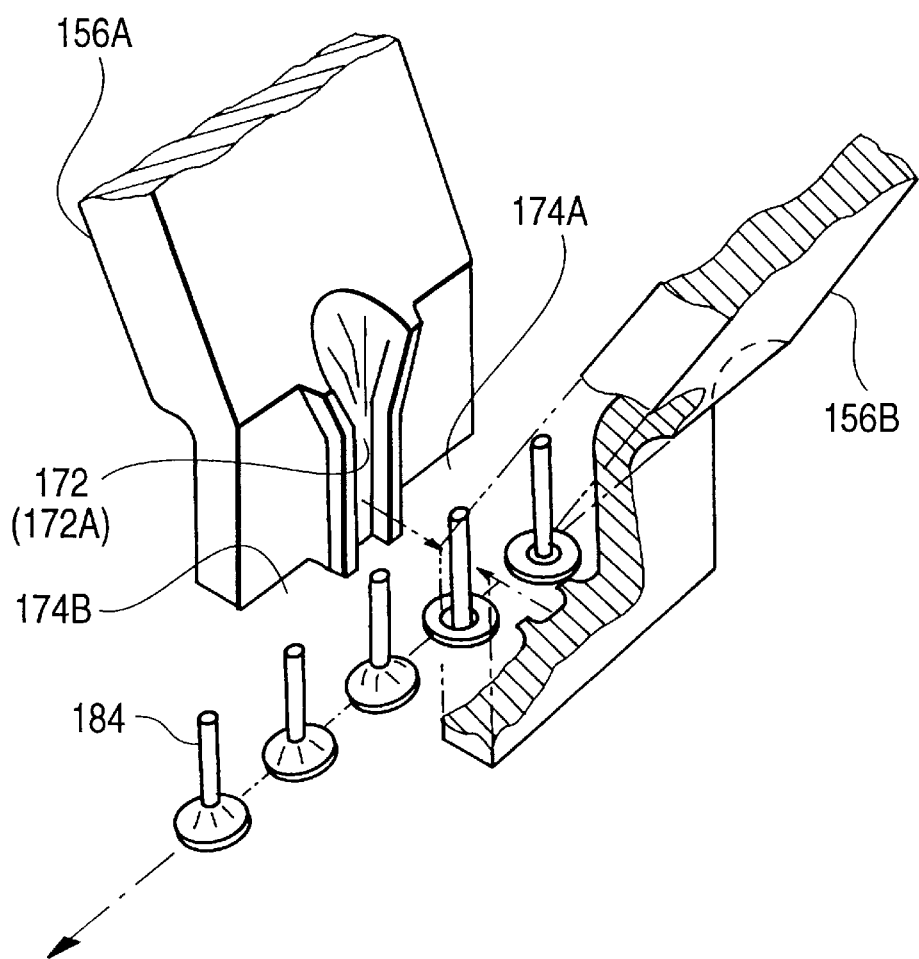
FIG. 12 is a partially ruptured perspective view showing a shape of ends of trowel members.

FIG. 12 is a partially ruptured perspective view showing the shape of the tip-end portion of the trowel members 156. Grooves 172A are formed on the opposing surfaces of these trowel members 156 (only one groove being shown in FIG. 12) so that a cavity defining a solder melting pot 172 is formed by grooves in the vicinity of the central portion when the both trowel members 156A and 156B are assembled. The tip-end of the assembled trowel members 156 has preheating/additional heating portions 174 (174A and 174B) positioned on the both sides of the solder melting pot 172.

In the embodiment, one of the preheating/additional heating portions 174 on the movement side serves as a preheating portion 174A (or 174B) in association with the actual moving direction of the workpiece, and the other portion 174 on the side opposed to the movement side functions as the additional heating portion 174B (or 174A). It is to be noted that positions of the preheating portion and the additional heating portions are naturally changed over when the moving direction of the workpiece is reversed.

In this embodiment, the solder melting pot 172 formed by the grooves 172A has a bore piercing in the vertical direction. When the trowel members 156 move down and the bottom faces thereof come close to the soldering point 184, the bottom opening of the solder melting pot 172 is closed by the soldering point 184. As a result, a solder melting pot 172 having the bottom being opened/closed by the soldering point is formed.

Operation

This soldering apparatus is used when a plurality of points to be soldered are aligned at predetermined intervals. For example, it is suitable when soldering a connector socket to a print wiring board.

Figure 13:
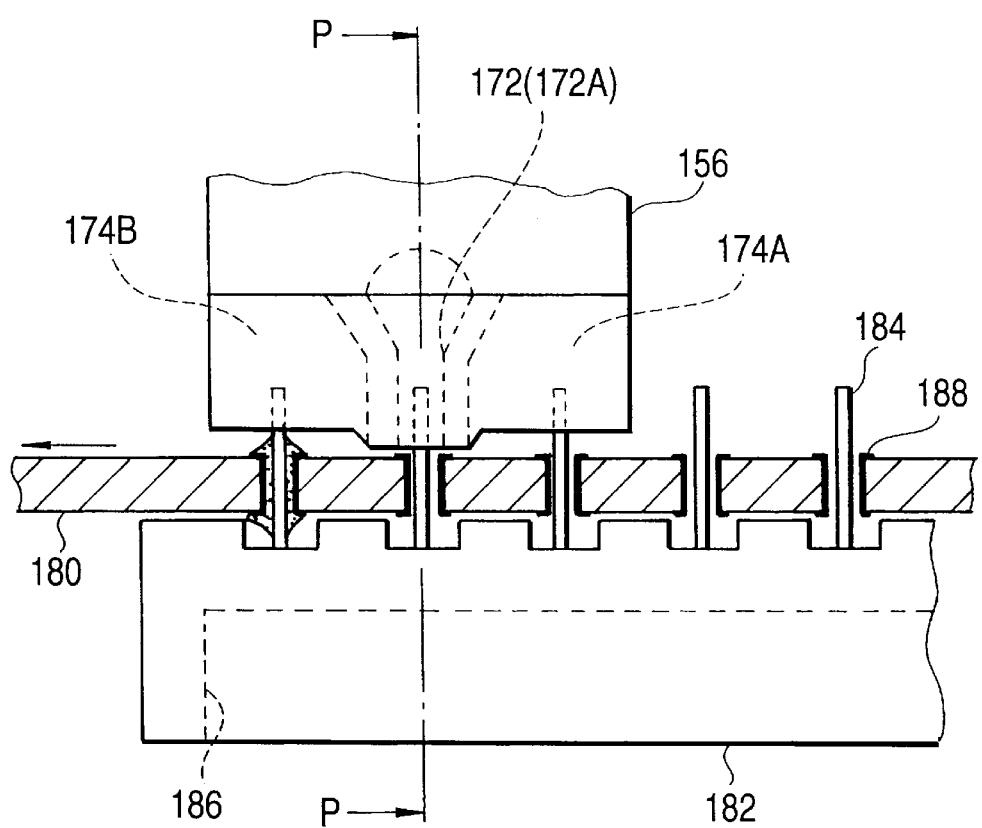
FIG. 13 is a sectional side elevation showing the soldering operation.
Figure 14:
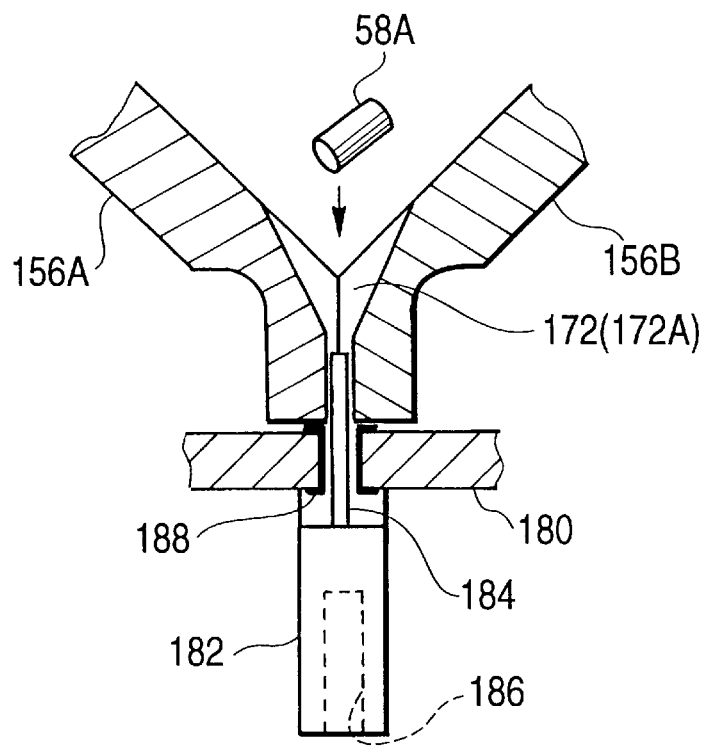
FIG. 14 is a cross-sectional view taken along the line P—P in FIG. 13 (when dropping a solder tip)
Figure 15:
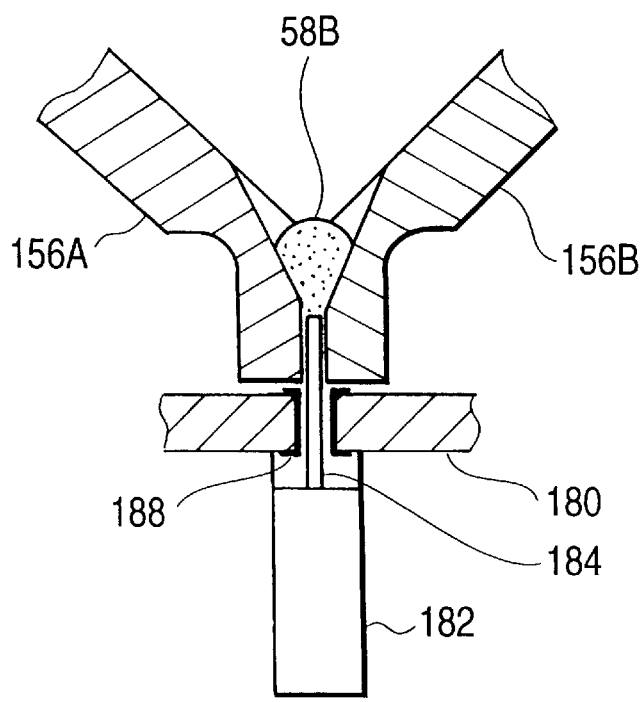
FIG. 15 is a cross-sectional view taken along the line P—P in FIG. 13 (when melting solder)
Figure 16:
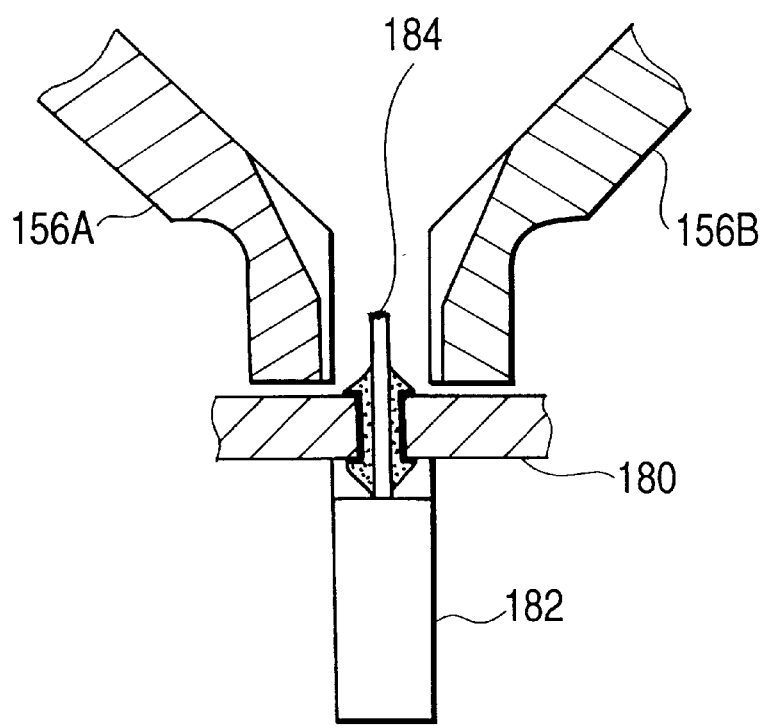
FIG. 16 is a cross-sectional view taken along the line P—P in FIG. 13 (when the trowel members are opened)

FIG. 13 is a sectional side elevation showing the soldering operation for a connector socket. FIGS. 14, 15 and 16 are cross-sectional views taken along the line P—P in FIG. 13. FIG. 14 shows the state when a solder tip is dropped; FIG. 15 shows the state when the solder is molten; and FIG. 16 shows the state when the trowel members are opened. In addition, FIG. 17 is an explanatory drawing of the continuous operation.

Referring to FIGS. 13 to 16, reference numeral 180 denotes a print wiring board as a workpiece to be processed and 182 designates a connector socket. The connector socket 182 has a plurality of pin-type lead wires linearly aligned, i.e., soldering point 184. The connector socket 182 also has a connector insertion hole 186 elongated in the lengthwise direction of the socket 182 and provided on the surface opposed to these lead wires 184 (FIG. 14). When a non-illustrated connector is inserted into the connector insertion hole 186, each lead wire 184 can be connected to the connector.

The lead wires 184 are thrusted into a plurality of through holes 188 provided on the print wiring board 180. In this state, the connector socket 182 is temporarily fixed to the print wiring board 180 by, an adhesive. The print wiring board 180 to which the connector socket 182 is temporarily fixed is held on the workpiece holder 170 of the moving device B. At this time, the alignment directions of the lead wires 184 are matched with the moving direction (Z-axial direction) of the workpiece holder 170.

After fixing the workpiece, i.e., the print wiring board 180 in this manner, the movable box 166 of the moving device B is moved in the horizontal direction (X direction) so that the solder melting pot 172 formed by the trowel members 156 is positioned above the lead wires 184 potioned on one end of the printing wiring board 180. The driving unit 168 of the moving device B is driven to position the main body A at a predetermined height (Y direction), and the continuous soldering operation is then started as follows.

On reception of a start signal, the controller 134 actuates the trowel members 156 to start heating and to be separated by a small gap by rotation of the motor 144. The motor 28 is actuated to lower the upper movable plate 20. When the trowel members 156 are positioned to a height at which the lead wire 184 can be grasped, the motor 144 is actuated to close the trowel members so that the solder melting pot 172 is formed. The solder melting pot 172 is then moved close to the lead wire 184 (the state shown in FIG. 14, FIG. 17A). That is, the bottom of the solder melting pot 172 is closed by the lead wire 184. In this state, the solder tip is dropped into the solder melting port 172 (FIG. 14).

In order to drop the solder tip 58A, the solder tip 58A is put in the cradle 92. More specifically, a pre-set length of the rod-shaped solder 58 is supplied by the solder tip supply assembly 52, and then the cutter pin 72 is lowered by the air cylinder 76 to cut a solder tip having a predetermined length. The thus cut solder tip 58A is allowed to fall down into the cradle 92. Solder supply and cutting operations are repeated until a desired number of solder tip 58A is contained in the cradle 92 of the solder tip guide assembly 80. The cradle 92 is inverted to drop the solder tip.

The cradle 92 is inverted as follows. When a start signal is fed, air is supplied into the air cylinder 44 to lower the bracket 40 together with the solder tip guide assembly 80. The pin 104 of the shaft 94 engages with the cam follower 110 to rotate the shaft 94 as shown in FIG. 10B as the assembly 80 is lowered.

When the spring 102 connected to the fore end of the stopper 100 moves beyond the unstable point at which the spring 102 passes the center axis of the shaft 94, the shaft 94 is rotated promptly to the position shown in FIG. 10C by the action of the spring 102. The cradle 92 is thus inverted, and the solder tips 58A leave from the cradle 92 while being applied with a shock of prompt inversion of the cradle 92 to fall through the guide bore 84 in the solder tip guide assembly 80 and then through the sleeve 86.

As the solder tip guide assembly 80 is moved to the lower position, the lower end of the sleeve 86 comes close to the solder melting pot 172 formed by the assembled trowel members 156 (FIG. 10C). The solder tips 58A fall through the sleeve 86 to be received in the solder melting pot 172. As the solder guide assembly 80 is lowered, the end of the lead wire 184 is inserted in-between the gap formed by the opposing ends of the trowel members.

The solder guide assembly 80 is returned back to the raised stand-by position shown in FIG. 10A. The trowel members 156 come closer with each other to grasp the end of the lead wire 184 by the ends thereof and the end of the lead wire 184 is heated during the time when the solder guide assembly 156 is raised. The trowel members 156 are opened and then closed repeatedly to ensure smooth contact between the solder tips 58A and the surface of the solder melting pot 172 and to realize uniform melting of the solder.

After the solder guide assembly 80 is returned back to the raised position, the cradle 92 is in the position as shown in FIG. 10A, and a light beam is emitted from the light emitting element 123 toward the solder melting pot 157. As the solder tips 58A are melted, the solder is liquefied (FIG. 15) to form a bead-shaped molten solder mass having a surface which reflects the light beam. The reflectivity of the molten solder is higher than that of the unmelted solid solder tip, so that the intensity of the reflected light beam is abruptly increased. A portion of the reflected light beam passes through the sleeve 86 and reflected by the mirror 127 provided on the outer surface of the bottom of the cradle 92 to be received by the light receiving element 124 (FIG. 10A).

On the other hand, the light receiving element 112B of the solder sensor senses the solder tips 58A falling through the guide bore 84. The signals generated from the light receiving element 112B are fed to the controller 67 which instructs the timer to begin counting of the lapse of time. When melting of the solder is detected by the light receiving element 112B, the controller 67 instructs another timer to begin counting of the lapse of time. Reference numeral 58B denotes molten solder in FIG. 15.

When the time duration goes beyond a predetermined time duration required for additional heating the molten solder to the desired temperature, the motor 144 is actuated to rotate the cam 148, whereby the trowel member carrier plates 142 are pushed outwardly to separate the trowel members 156. Whereupon, the molten solder 58B contained in the solder melting pot 172 drops onto the soldering point of the workpiece to effect soldering (FIG. 16). By opening and closing the trowel members 156 repeatedly, dropping of the molten solder 58B is ensured.

Figure 17A:
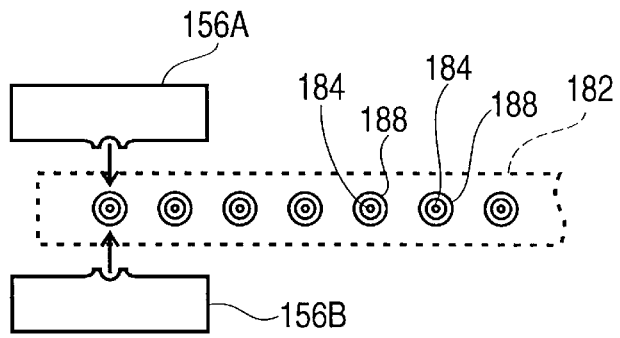
FIGS. 17A, 17B, 17C and 17D are explanatory drawings of a continuous operation.
Figure 17B:
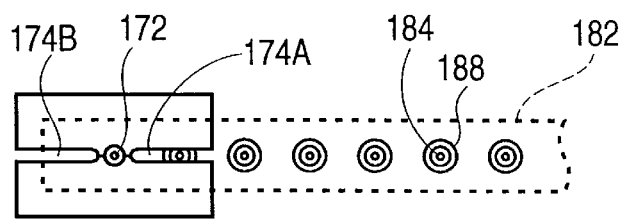

The molten solder 58B falling from the solder melting pot 172 is absorbed into a gap between the lead wire 184 as a soldering point and the through hole 188 by capillary phenomenon, and the state shown in FIG. 16 is obtained. While the trowel members 156 are supplying the molten solder to one soldering point in this manner, the preheating portion 174A adjacent to the solder melting pot 172 is positioned close to the next lead wire 184 (to which solder is subsequently supplied), and this adjacent lead wire 184 is preheated (FIG. 17B).

Figure 17C:
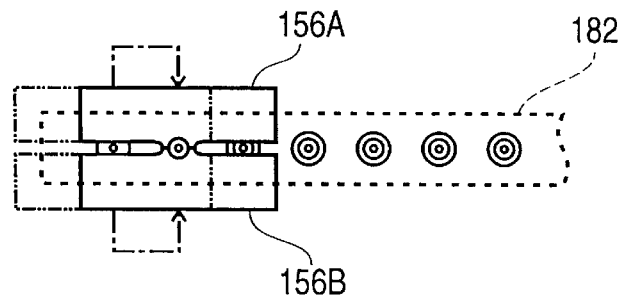

Upon completion of supply of the molten solder, the trowel members 156 move up together with the upper movable plate 20 by the motor 28. At this time, the workpiece support 170 carrying the workpiece 182 moves in the Z-axial direction. Specifically, the workpiece support 170 moves in one direction by a distance corresponding to the pitches or intervals of the lead wires 184 of the connector socket 182. Therefore, the lead wire 184 preheated by the preheating portion 174 is positioned below the assembled trowel members 156 as described above. In this state, the trowel members 156 are lowered and the solder tip 58A is supplied to the solder melting pot 172. The solder tip is melted and the molten solder is supplied to the next soldering point (FIG. 17C).

Here, the additional heating portion 174B of the trowel members 156 are placed close to the lead wire 184 to which the molten solder 58B was most recently supplied by the preceeding solder supplying operation and additionally heats this lead wire 184. Accordingly, additional heating can avoid "knotty or tubercled soldering" caused due to insufficient heat, thereby improving the reliability of soldering. At this time, the preheating portion 174A comes to a position close to a next soldering point and preheats this point. Therefore, flow of the molten solder is enhanced during supply of the molten solder, which leads to improvement in the reliability of soldering.

Figure 17D:
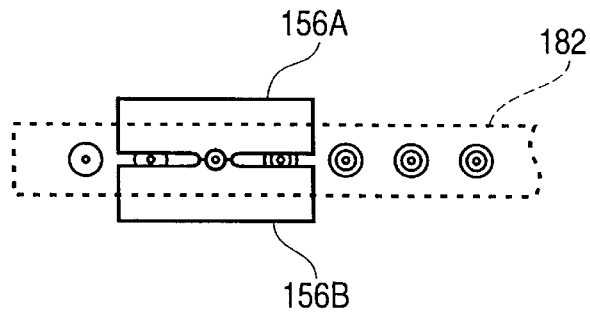

As described above, soldering is repeated with predetermined cycles while sequentially feeding the workpiece support 170 in accordance with pitches of the lead wire 184 (FIG. 17D). With such an arrangement, the time for maintaining the trowel members to perform additional heating after supply of the molten solder (additional heating time) can be omitted. Thus, a plurality of points to be soldered can be efficiently soldered. Further, a soldering point to which solder is subsequently supplied can be preheated by the preheating portion 174A while supplying solder to the adjacent soldering point, thereby enabling the efficient soldering.

Although the workpiece support 170 can be intermittently moved, it may be continuously moved at a fixed speed. In such a case, it is preferable that the groove(s) 172A of the solder melting pot 172 is formed so that a sufficient gap can be provided in the moving direction of the workpiece in order to allow the lead wire 184 to move in the opening of the solder melting pot 172.

Another Embodiment

Figure 18:
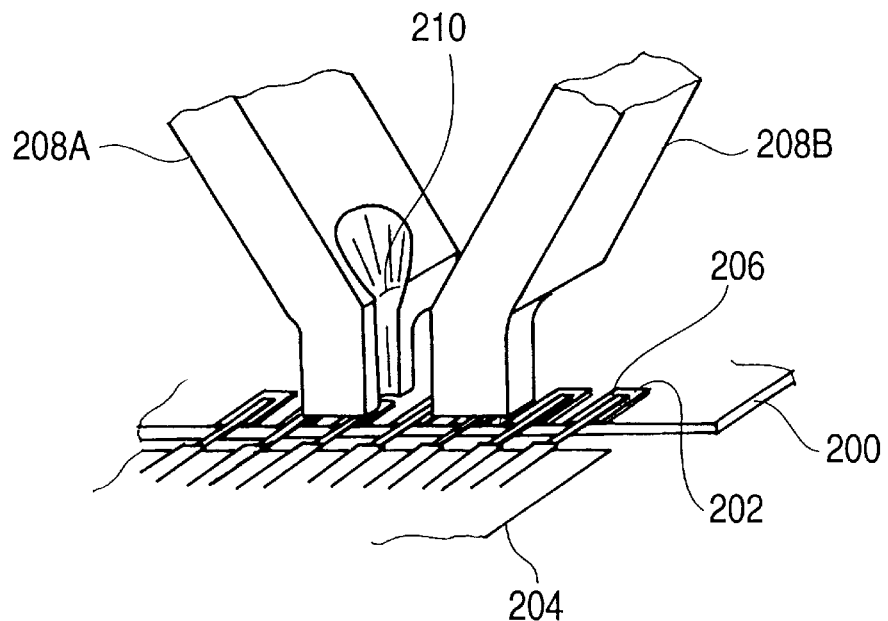
FIG. 18 is a perspective view showing the trowel members of another embodiment.
Figure 19:
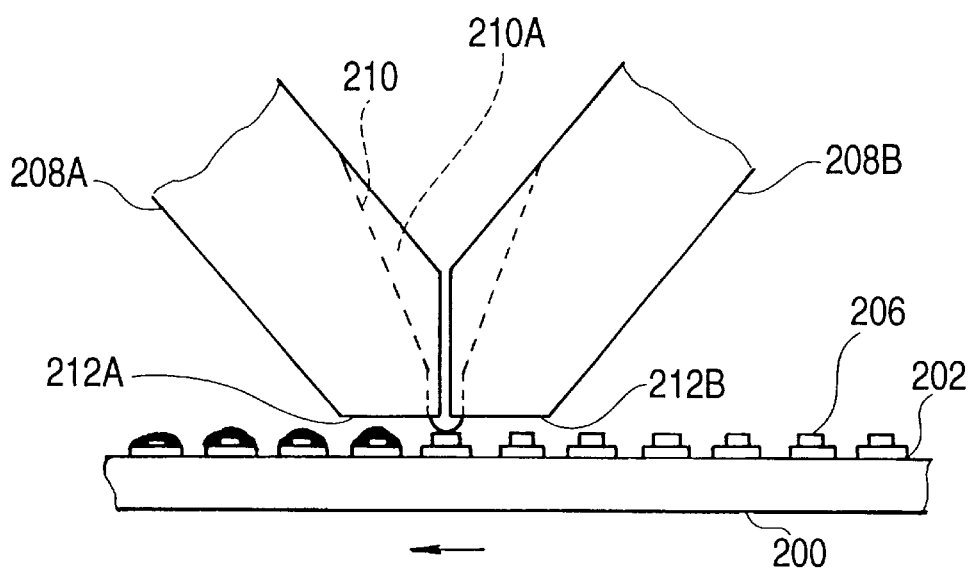
FIG. 19 is a view for illustrating the operation of the embodiment of FIG. 18.

FIG. 18 is a perspective view showing trowel members of another embodiment, and FIG. 19 is an explanatory drawing of the operation thereof. This embodiment uses the apparatus illustrated in FIGS. 1 to 17 to solder cable terminals of a flat cable to a print wiring board.

In these figures, reference numeral 200 denotes a print wiring board and 202 designates lands formed on the print wiring board 200. Reference numeral 204 represents a flat cable having one side edge from which cable terminals 206 aligned at predetermined intervals (pitches) protrude. The lands 202 are formed at the same pitches as that of the cable terminals 206. Each cable terminal 206 is superimposed on an associated land 202 to form a point to be soldered.

Trowel members 208 (208A and 208B) have a shape which is somewhat different from that of the elements illustrated in FIGS. 1 to 17. That is, a solder passage or groove 210 piercing in the vertical direction is formed between assemblies of the trowel members 208, and the cavity defining a solder melting pot 210A is formed by the solder passage 210, the cable terminal 206 and the land 202 at a point to be soldered.

The lower surfaces of the trowel members 208 are so formed as to be wide in the alignment direction of the soldering points, i.e., the alignment direction of the lands 202, and these lower surfaces serves as preheating/additional heating portions 212 (212A and 212B). In FIG. 19, since a workpiece (the print wiring board 200) is fed toward the left hand side, 212A functions as an additional heating portion and 212B acts as a preheating portion.

According to this embodiment, the trowel members 208A and 208B are assembled on the land 202 as shown in FIG. 19 in order to form the solder melting pot 210A. A solder tip (not shown) is dropped in the pot 210A to be molten. By raising the trowel member 208, the molten solder falls onto the land 202 and the cable terminal 206. Since the cable terminal 206 and the land 202 are preheated by the preheating portion 212B, the molten solder flows into a gap between the cable terminal 206 and the land 202 by capillary phenomenon.

If the workpiece 200 moves in a direction indicated by an arrow in FIG. 19, the soldering point (206, 202) to which the molten solder was supplied gets under the additional heating portion 212A to be heated. The molten solder, therefore, assuredly flows between the cable terminal 206 and the land 202. When the workpiece 200 further moves, this soldering point gets out of the additional heating portion 212A to be cooled down.

Although the above has explained the embodiments in which the lead wire 184 or the cable terminal 206 is soldered to the through hole 188 or the land 202, the present invention is not restricted thereto. When trowel members having a shape associated with a point to be soldered are used, the present invention can be applied to soldering with respect any other member than the lead component or the flat cable. For example, the present invention can be applied to soldering for a surface mounting type IC having a gull-wing lead wire.

As described above, according to the present invention, the additional heating portion which comes close to the solder melting pot is formed to the trowel member(s). The additional heating portion heats a soldering point to which molten solder has already been supplied by the prior molten solder supplying operation, while the solder melting pot supplies solder to the next soldering point. Accordingly, the trowel members do not have to be held at the soldering point after supply of solder for additionally heating. Since an independent additional heating time does not have to be provided, the processing speed can be increased to improve the throughput.

Moreover, according to the present invention, since the preheating portion is formed to the trowel member(s) on the opposed side of the additional heating portion with the solder melting pot therebetween, it is possible to preheat the next soldering point while the current soldering point is soldered and the prior soldering point is additionally heated. The preheating time, therefore, does not have to be additionally provided, which leads to the improved throughput.

What is claimed is:

1. A soldering method for soldering plural soldering points aligned at a predetermined interval; comprising the steps of forming a solder melting pot by assembling plural trowel members, each of the trowel members having a surface made of a solder repellent material at least the portion contacting with the solder; supplying a solder tip having a constant volume to said solder melting pot; and sequentially supplying the molten solder to the respective soldering points from the solder melting pot:

an improved method wherein an additional heating portion which comes close to said solder melting pot is formed to said trowel members, and wherein the soldering point to which molten solder has been supplied by prior molten solder supply operation is additionally heated during the supply operation of the molten solder to the next soldering point.

2. The soldering method according to claim 1, wherein said solder melting pot is formed by engaging said plural trowel members, and the molten solder is supplied to the soldering point by separating said trowel members.

3. The soldering method according to claim 1, wherein grooves are formed on the opposing surfaces of said plural trowel members so that a cavity defining said solder melting pot having an opening at the bottom of the pot is formed by the grooves when said plural trowel members come close together; and wherein, when the trowel members are lowered to come close to the soldering point, the bottom opening of said solder melting pot is closed by an upper surface of the soldering point and the solder tip is supplied to the solder melting pot and molten.

4. The soldering method according to claim 3, wherein said trowel members are moved up to allow the molten solder to drop through the bottom opening of the solder melting pot onto the soldering point.

5. The soldering method according to claim 3, wherein said trowel members are separated to allow the molten solder to drop onto the soldering point.

6. The soldering method according to claim 1, wherein said plural trowel members engages together to form plural solder melting pots, and wherein plural solder tips are supplied to the respective solder melting pots to be molten and then the respective molten solders are simultaneously supplied to different soldering points.

7. The soldering method according to claim 1, wherein a workpiece having said plural soldering points aligned at the predetermined interval is continuously moved with respect to said trowel members in a direction along the aligned soldering points, and said solder melting pot intermittently supplies molten solder at pitches of said soldering points.

8. The soldering method according to claim 1, wherein a preheating portion which comes closer to the opposed side of said additional heating portion with said solder melting pot therebetween is provided to said trowel members; and wherein said trowel members performs each of a preheating operation, a molten solder supplying operation and an additional heating operation to each soldering point while sequentially moving toward said preheating portion.

* * * * *